United States Patent [19]

Lazarus

[11] Patent Number: 5,218,324

[45] Date of Patent: Jun. 8, 1993

[54] DEVICE FOR THE CONTROL OF A PHASE-LOCKED LOOP WITH FREQUENCY CHANGING

[75] Inventor: Michel Lazarus, Gif S/Yvette, France

[73] Assignee: Thomson-CSF, Puteaux, France

[21] Appl. No.: 893,251

[22] Filed: Jun. 3, 1992

[30] Foreign Application Priority Data

Jun. 14, 1991 [FR] France .................. 91 07318

[51] Int. Cl.⁵ .......................................... H03L 7/16
[52] U.S. Cl. ................... 331/1 A; 331/14; 331/16; 331/25; 331/30
[58] Field of Search .......... 331/1 A, 14, 16, 25, 331/30

[56] References Cited

U.S. PATENT DOCUMENTS

| | | | |
|---|---|---|---|
| 4,095,190 | 6/1978 | Imazeki et al. | 331/16 X |
| 4,218,656 | 8/1980 | Lazarus | 455/59 |
| 4,318,055 | 3/1982 | Hopwood et al. | 331/12 |
| 4,523,157 | 6/1985 | Sato | 331/4 |
| 4,682,175 | 7/1987 | Lazarus | 342/165 |
| 4,739,330 | 4/1988 | Lazarus | 342/122 |
| 4,792,767 | 12/1988 | Lazarus et al. | 331/1 A |

FOREIGN PATENT DOCUMENTS

0369660  5/1990  European Pat. Off. .
1335450  7/1963  France .

Primary Examiner—Siegfried H. Grimm
Attorney, Agent, or Firm—Marmorek, Guttman & Rubenstein

[57] ABSTRACT

A device for the control of a phase-locked loop with frequency changing comprises an oscillator (10), a mixer (20) of signals, and a phase/frequency detector (40). The control device comprises a frequency comparator (60) to compare the frequency Fv of the signal given by the oscillator and the transposition frequency Fx, and an inhibiting circuit (70) sensitive to the frequency comparator and interposed between the mixer and the phase/frequency detector to block the beat frequency Fv−Fx at input of the phase/frequency detector. The disclosed device can be used to release the loop automatically during major changes in the loop control frequency F.

10 Claims, 5 Drawing Sheets

FIG_1
PRIOR ART

FIG_2a
PRIOR ART

FIG_2b
PRIOR ART

FIG_3

FIG_4

FIG_5

FIG_6

FIG_7

FIG_8

FIG_9

FIG_10

DEVICE FOR THE CONTROL OF A PHASE-LOCKED LOOP WITH FREQUENCY CHANGING

BACKGROUND OF THE INVENTION

1. Field of the Invention

The invention relates to a device for the control of a phase-locked loop with frequency changing used in frequency synthesizers in general and more particularly in the frequency generation circuits of Doppler radars.

Phase-locked loops with frequency changing are commonly used in frequency synthesizers for the generation, from a reference clock, of a variable signal having a pre-determined stable frequency.

2. Description of the Prior Art

Figure 1:
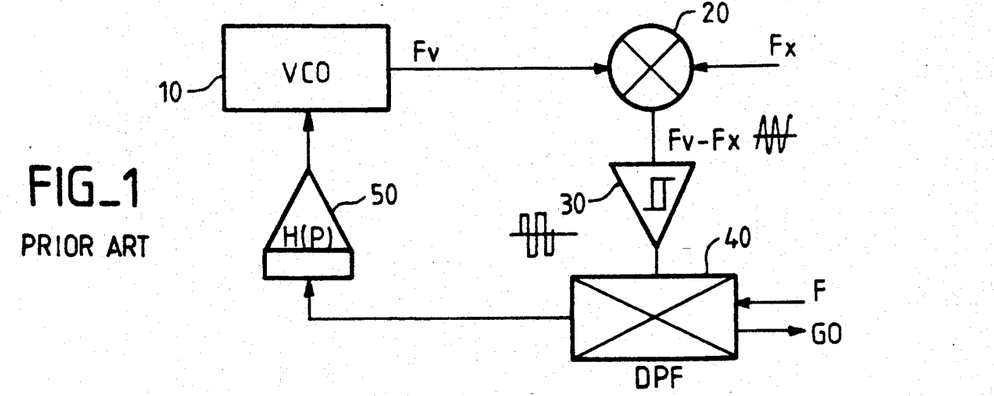
FIG. 1 is a functional diagram of a phase-locked loop with frequency changing, known in the prior art.

FIG. 1 shows an example of a phase-locked loop with frequency changing that can be used in a frequency synthesizer. The phase-locked loop typically comprises an oscillator 10, a mixer 20, a limiting amplifier 30, a phase/frequency detector (PFD) 40 and a pseudo-integrator amplifier 50. The oscillator 10, such as a voltage-controlled oscillator (VCO), gives a synthesis signal having a pre-determined frequency Fv in response to a servo signal. The mixer 20 connected to the oscillator receives the synthesis signal and a first reference signal (from a reference clock) having a frequency Fx (transposition frequency) to give a third signal representing a beat frequency (Fv−Fx). The first reference signal is typically generated by a quartz oscillator not shown in the figure. The third signal is put into logic form by the limiting amplifier 30 to drive the phase/frequency detector 40. The phase/frequency detector also receives a second reference signal having a frequency F that may vary in a wide range between the values Fmin and Fmax with Fmax/Fmin being greater than 30. Generally, the second reference signal is derived from the first reference signal (division of the frequency of the reference clock signal by an integer n). The phase/frequency detector, which is known per se, detects or does not detect an identity of phase (and consequently an identity of frequency) between the third signal and the second reference signal to give, firstly, a logic control signal GO and, secondly, the servo signal (a DC voltage), the level of which is a function of the phase difference between the third signal and the second reference signal. The servo signal is amplified by the amplifier 50 to match the dynamic range of control of the oscillator 10. Should the phase-locked loop be locked, the frequency Fv of the oscillator 10 is equal to Fx+F and the logic level of the control signal GO is at 1. If not, the logic level of the control signal GO is at 0.

Should the frequency F be derived from the transposition frequency Fx, by the changing of the value of the frequency divider integer n, the frequency F goes from a value F1 to a value F2 instantaneously. When the ratio F1/F2 is high, the phase-locked loop gets unlocked in phase and the control signal GO goes to the logic level 0. There are two possible cases:

FIRST CASE: F2>F1

Figure 2A:
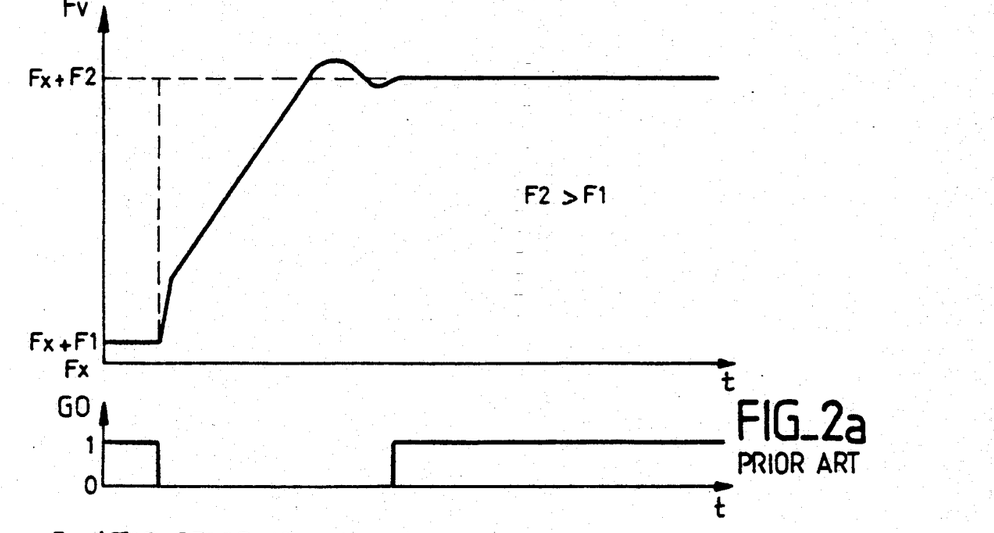
FIGS. 2(a) and 2(b) give a view, in the form of timing diagrams, of the level of the control signal as a function of the beat frequency obtained in the phase-locked loop of FIG. 1, according to the cases F2>F1 and F1<F1.

In this case, the loop remains locked in frequency and the frequency Fv of the oscillator 10 increases, under the effect of the servo signal, until it is in phase with the frequency Fx+F2. The control signal GO then resumes the logic level 1 as can be seen in FIG. 2(a).

SECOND CASE: F2<F1

Figure 2B:
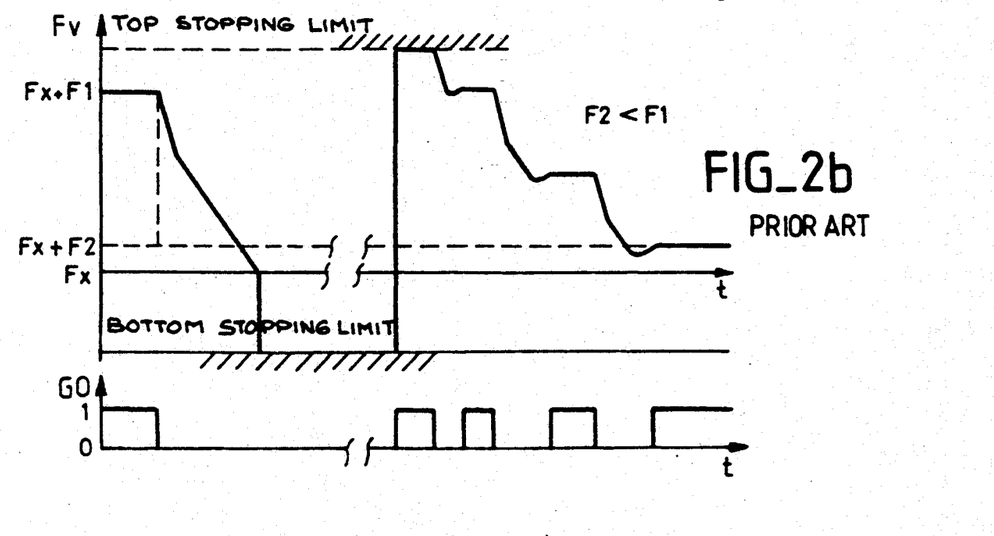

It is then necessary to distinguish between two cases according to the value of the ratio F1/F2:

if the value of the ratio F1/F2 is lower than 3 (approximately), then the behavior of the loop is similar to that of the preceding case, i.e. the frequency Fv of the oscillator decreases until it is in phase with the frequency Fx+F2;

if the value of the ratio F1/F2 is far greater than 3, then the frequency Fv of the oscillator decreases sharply and, since the loop has a second order transfer function (corresponding to an "overshoot"), the frequency Fv becomes lower than the transposition frequency Fx (FIG. 2(b)) which prompts a phase rotation by $\pi$. The phase-locked loop then goes into feedback, the phase/frequency detector delivering a servo signal that drives the oscillator towards its bottom stopping limit where it remains stuck, the control signal GO then having a logic level 0.

Until now, the releasing of the phase-locked loop has been done by providing for an external element which monitors the logic level of the control signal GO to set off a process of unlocking when this control signal remains at the logic level 0. The unlocking process consists typically of the injection, at the control input of the oscillator (servo input), of a higher voltage than the one given by the pseudo-integrator amplifier 50 to bring the oscillator to its top stopping limit. It is then necessary to apply the second reference signal at the frequency F to the phase/frequency detector, and then carry out the operation by several stepped levels to bring the frequency F of the second reference signal to the desired frequency F2. An unlocking process of this kind can be managed appropriately only by a microprocessor, which is complicated to implement. Besides, the unlocking method neutralizes several cycle periods, which entails penalties in terms of time. Besides, the changeover switch enabling the injection of a voltage into the control of the VCO reduces the spectral purity of this oscillator.

An aim of the invention is to overcome the drawbacks of the prior art by proposing a digital device that enables the automatic and autonomous releasing of a phase-locked loop with frequency changing.

Another aim of the invention is to provide a device such as this for the control of the phase-locked loop with frequency changing that is designed to be integrated into an application specific integrated circuit (ASIC) and hence costs very little.

Yet another aim of the invention is to provide a device for the control of a phase-locked loop with frequency changing that enables a fast releasing of the phase-locked loop during major changes in frequency and resolves the subsidiary problem of the prepositioning of the oscillator when it is turned on.

Essentially, the invention consists in making provision, in a phase-locked loop with frequency changing comprising a voltage-controlled oscillator with a frequency Fv and a transposition frequency Fx, for a device, in the form of a circuit, which permanently compares the frequency Fv of the oscillator with the transposition frequency Fx by means of a digital counting device and blocks the beat frequency (Fv−Fx) at input of the phase/frequency detector when Fv becomes lower than Fx, so as to bring the frequency of the oscillator into the range of frequencies higher than Fx. By blocking the beat frequency at input of the phase/frequency detector in the above-mentioned case, the phase/frequency detector generates a servo signal which drives the oscillator towards its top limit. The phase-locked loop may then again be locked without acting on the control signal of the loop (frequency signal F). In addition to this advantage of the invention, there is the advantage wherein the oscillator is automatically prepositioned when the circuits of the loop are turned on, in fact as soon as the comparison of frequency is done.

SUMMARY OF THE INVENTION

More specifically, an object of the invention is a device for the control of a phase-locked loop with frequency changing comprising an oscillator controlled by a servo signal to give a synthesis signal having a pre-determined frequency, a mixer of signals sensitive to the synthesis signal and to a first reference signal having a first reference frequency to give a third signal representing a beat frequency, a detector means to detect a phase difference between the third signal and a second reference signal, the detector means giving the servo signal in response to this detection, wherein it comprises a frequency comparator means to compare the frequency of the synthesis signal and the frequency of the first reference signal, and an inhibiting means sensitive to the frequency comparator means and interposed between the mixer and the detector means to inhibit the third signal at input of the detector means.

Advantageously, the frequency comparator means compares the frequency of the synthesis signal and the frequency of the first reference signal with a hysteresis to give an inhibiting logic signal that represents the result of the comparison, the logic signal having a first logic level when the frequency of the synthesis signal is greater than the frequency of the first reference signal plus the hysteresis and the inhibiting signal having a second logic level when the frequency of the synthesis signal is lower than the frequency of the first reference signal minus the hysteresis.

The inhibiting means is constituted by a logic gate receiving, at input, the third signal and the inhibiting signal to inhibit the third signal when the inhibiting signal has a logic level corresponding to the second logic level.

The inhibiting means is constituted by an AND gate and the second logic level of the inhibiting signal corresponds to the logic level 0.

The frequency comparator means is constituted by two symmetrical binary counting means that are controllable, for the counting up to a pre-determined maximum counting value, respectively by the synthesis signal and the first reference signal, each counting means having an output to give an end-of-counting signal, and the comparator means further comprising a means sensitive to the end-of-counting signals to memorize that one of the two counting means which first gives an end-of-counting signal and to give the inhibiting signal.

Each counting means is constituted by a binary counter with several stages, the first stage having a command for resetting at 1 and a command for resetting at 0 and the upper stages having a command for resetting at 0, and the end-of-counting signal of a counting means controlling the resetting at 1 of the first stage of said counting means and the resetting at 0 of the first stage of the symmetrical counting means.

The frequency comparator means further includes means for the resetting at 0 of the upper stages of the binary counters which are controlled by the end-of-counting signals.

The means for the resetting at 0 of the upper stages are constituted by OR logic gates enabling the application, simultaneously with the resetting at 1 of the first stage of a binary counter, of the resetting at 0 of the upper stages of said counter in response to the end-of-counting signal given by said binary counter.

The maximum counting value is greater than $(Fx/2.F2min)+2$, where

Fx is the frequency of the first reference signal;
F2min is the minimum frequency of the second reference signal The control device further includes two pre-dividers with a fixed ratio to respectively divide the frequency of the synthesis signal and the frequency of the first reference signal before their application to the input of the frequency comparator means.

BRIEF DESCRIPTION OF THE DRAWINGS

Other features and advantages of invention shall appear even more clearly from the following detailed description, made with reference to the appended drawings, of which.

MORE DETAILED DESCRIPTION

Figures 3, 4:
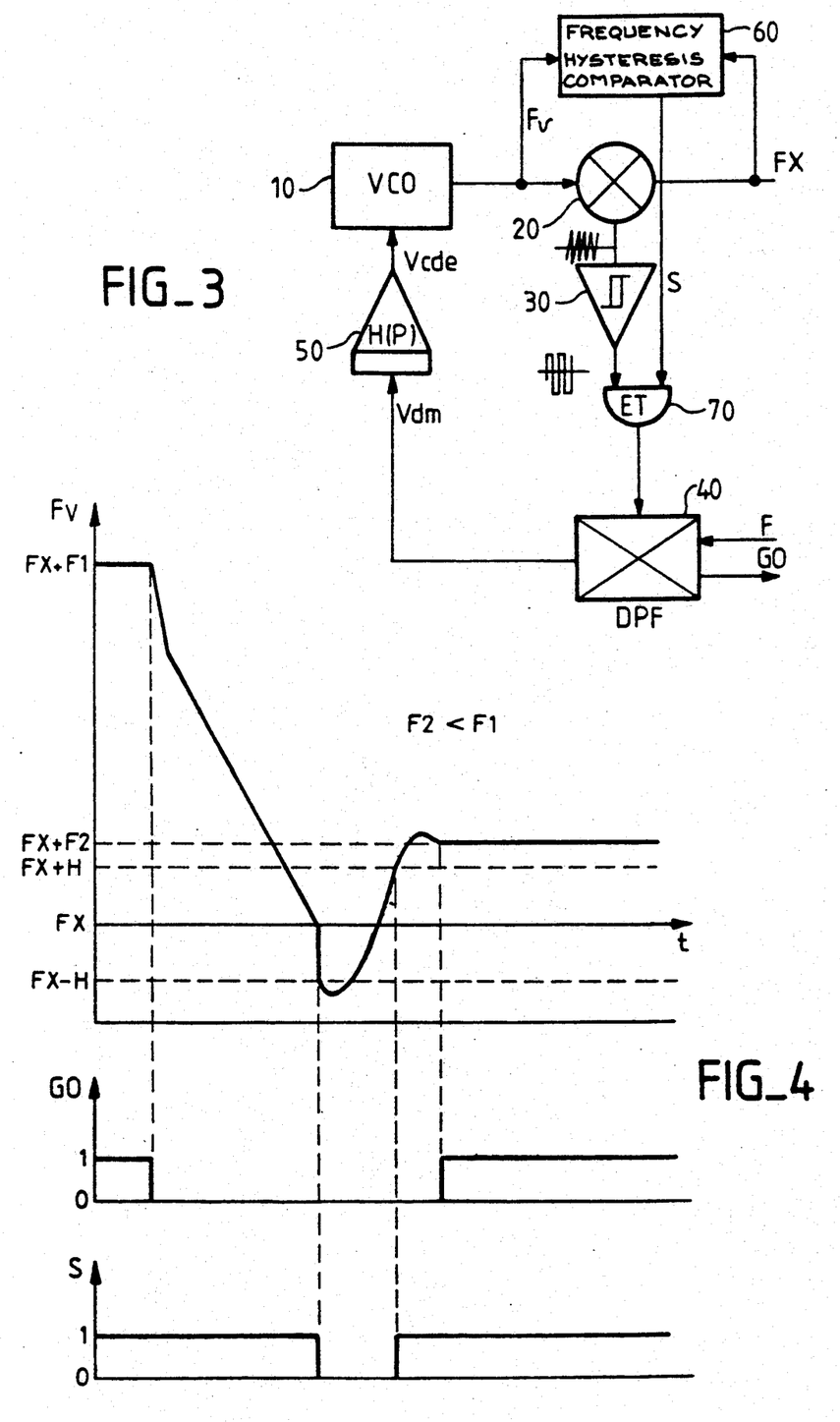
FIG. 3 is a functional diagram of a phase-locked loop with frequency changing comprising the control device according to the invention.
FIG. 4 gives a view, in the form of a timing diagram, of the level of the control signal and of the level of the inhibiting signal as a function of the beat frequency obtained in the phase-locked loop of FIG. 3, in the case F2<F1.

In the figures, the same numerical references refer to the same elements. Referring to FIG. 3, the phase-locked loop with frequency changing comprises a (VCO) oscillator 10, a frequency mixer 20, a limiting amplifier 30, a phase/frequency detector 40, a pseudo-integrator amplifier 50. These circuits are similar to those shown in FIG. 1. According to the invention, a frequency comparator 60 with hysteresis is parallel-connected with the frequency mixer 20, the frequency comparator controlling an AND logic gate 70 which inhibits the third signal given by the mixer at input of the phase/frequency detector 40.

The frequency comparator 60 receives the synthesis signal and the first reference signal at input. At output, it gives an inhibiting logic signal S representing the result of the comparison of the frequency Fv of the synthesis signal and of the frequency Fx of the first reference signal with a pre-determined hysteresis H.

The inhibiting logic signal S is such that its logic level is at 1 when the frequency of the synthesis signal is greater than the transposition frequency plus the hysteresis (Fv>Fx+H) and the logic level of the inhibiting signal S is at zero when the frequency Fv of the synthesis signal is lower than the transposition frequency Fx minus the hysteresis (Fv<Fx−H). Referring to FIG. 4, we have shown the development of the level of the inhibiting logic signal S and the development of the logic control signal GO as a function of the variation in frequency of the second reference signal (control signal of the phase-locked loop). If the frequency F of the second reference signal is controlled to go to a value F2 that is far lower than an original value F1, the phase-locked loop gets unlocked and the frequency Fv becomes lower than the bottom threshold Fx−H of the frequency/hysteresis comparator. The inhibiting logic signal S then goes instantaneously to the logic level 0. This inhibiting logic signal is applied to an input of the AND gate 70 while the third signal put into logic form by the limiting amplifier 30 is applied to the other input of the AND gate. When the inhibiting logic signal has a 0 logic level, the output of the AND logic gate, which is connected to the phase/frequency detector, has a logic level 0. The phase/frequency detector 40 then receives, at input, a continuous signal with a logic level 0 and the second reference signal (in logic form) at the frequency F2. In response to these two signals, the phase/frequency detector 40 detects a maximum phase difference and gives a servo signal (a DC voltage) having a maximum level. This servo signal is adapted to the input dynamic range of the oscillator by the pseudo-integrator amplifier 50 having a transfer function H(p) to control the oscillator 10 in rising frequencies until the top threshold Fx+H is exceeded. The inhibiting logic signal then goes back to the logic level 1 to let through the beat frequency at input of the phase/frequency detector 40. The phase/frequency detector 40 then delivers a servo signal controlling the oscillator 10 to re-lock the phase-locked loop in phase owing to the fact that the hysteresis H has a value close to the minimum value of the frequency F2 (F2min). Consequently, the control device of the phase-locked loop with frequency changing is autonomous and enables the phase-locked loop to get locked in a very short time, whatever may be the control of the frequency F of the second reference signal: this is so also during the turning on of the circuits of the phase-locked loop.

In FIG. 3, the inhibiting means 70 is an AND logic gate interposed between the limiting amplifier 30 and the phase/frequency detector 40. Consequently, so long as the logic level of the inhibiting signal S is at 1, i.e. when the frequency Fv of the synthesis signal is higher than the frequency Fx of the first reference signal plus the hysteresis H, the AND logic gate lets through the signal representing the beat frequency Fv−Fx towards the phase/frequency detector. When the logic level of the inhibiting signal S is equal to 0, i.e. when the frequency Fv of the synthesis signal is lower than the frequency Fx of the first reference signal minus the hysteresis H, the AND logic gate inhibits the signal representing the beat frequency at input of the phase/frequency detector 40.

It is easy to replace the AND logic gate by OR, NOR, NAND or similar logic gates and make direct use of the inhibiting logic signal S or a logic signal that is a complement of the signal S (two's complement) depending on the type of gate used to control the logic gate considered.

Figure 5:
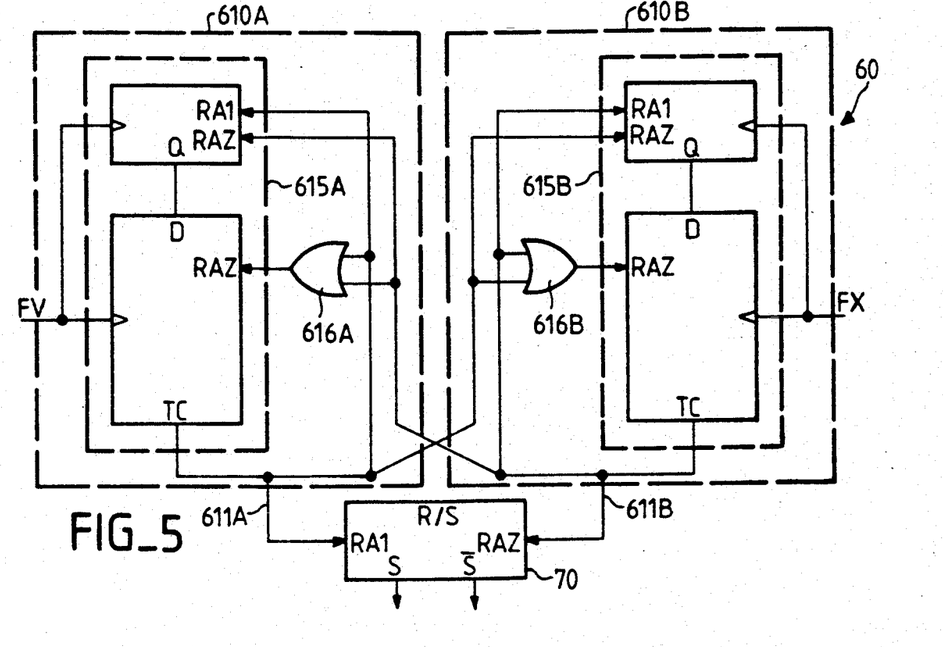
FIG. 5 is a functional diagram of the frequency comparator means of the control device according to the invention.

A description shall now be given of the hysteresis/frequency comparator 60 with reference to FIG. 5. It has two counting means 610A, 610B which are symmetrical The counting means, which are binary counters, are controlled respectively by the synthesis signal at the frequency Fv and the first reference signal at the frequency Fx to count up to a pre-determined maximum counting value, common to both counters. The binary counters 610A, 610B each have an output 611A, 611B to give end-of-counting signals TC. The end-of-counting signals TC are given to a logic flip-flop 70 (an R/S flip-flop) which delivers the inhibiting logic signal S as well as a complementary signal corresponding to the two's complement of the inhibiting logic signal S. In FIG. 5, the signal TC of the counter 610A feeds the resetting-at 1 input of the flip-flop 70 and the signal TC of the counter 610B feeds the resetting-at-0 input of the flip-flop 70. Depending on the type of gate used for the locking means 70, one of the two inhibiting logic signals will be chosen so as to block the beat frequency appropriately.

Figure 6:
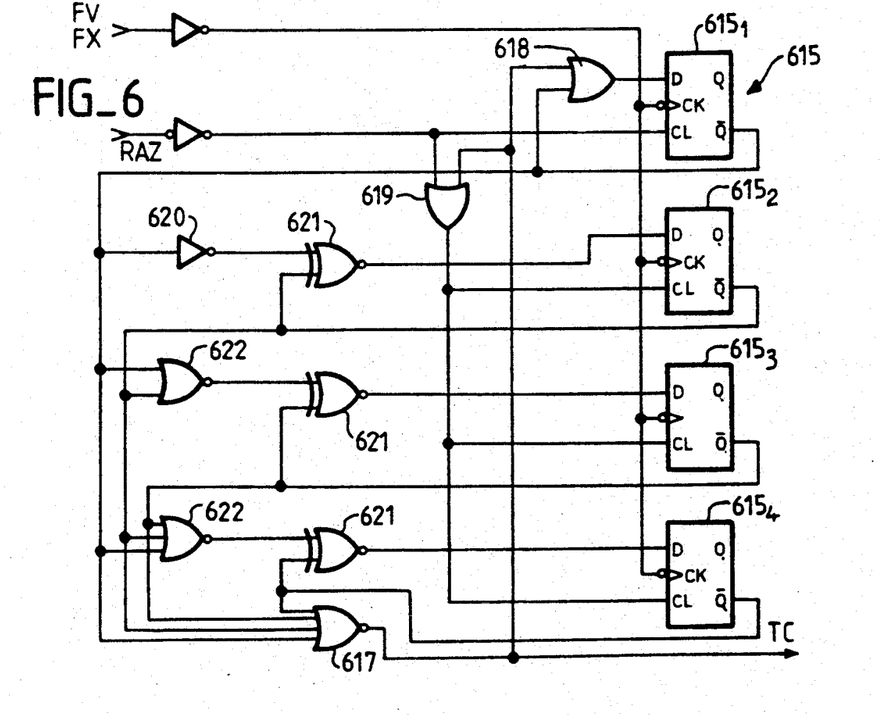
FIG. 6 shows a detailed view of a digital counter of the comparator means of FIG. 5.

Each binary counter includes several stages 615 which can be seen in FIGS. 5 and 6. The first counting stage (the least significant bit) comprises a resetting-at-1 control input (RA1) and a resetting-at-0 control input (RAZ). The upper stages comprise only a resetting-at-0 control input (RAZ). The end-of-counting signal TC of each binary counter 610 controls the resetting-at-1 of the first counting stage of the counter considered and the resetting-at-0 of the first stage of the symmetrical binary counter. Two OR logic gates 616A, 616B, respectively controlled by the end-of-counting signals TC, enable the simultaneous application of the resetting at 1 of the first stage and the resetting at 0 of the upper stages of the binary counters.

The frequency comparator works as follows. Assuming that the frequency Fv is greater than the frequency Fx, the counter 610A of the clock Fv is the first to reach the end of counting, and its output TC which goes to 1:

resets the stages of the counter 610B of the clock Fx at 0;

resets the first stage at 1 and the upper stages of the counter of the clock Fv at 0.

During the next counting cycle, the counter 610A of the clock Fv starts from 1 while the counter 610B of the clock Fx starts from 0.

If $N=2^q$ is the maximum counting value, q being the number of stages in a counter, the counter 610A reaches the end of counting (state N−1) after N−2 periods and its end-of-counting signal TC goes to 1: this positions the flip-flop R/S at 1 and hence the inhibiting logic signal at the logic level 1. In the meantime, the counter 610B which started from 0 has not been able to reach the end of counting for the frequency Fv is greater than the frequency Fx, and the same cycle starts again. Consequently, the highest frequency always dictates a handicap of one counting stroke on the other frequency. To invert this situation, the frequency Fx should become higher than Fv by a quantity such that the counter 610B takes two counting strokes in only one cycle.

This condition is expressed by:

$$Fv = Fx \cdot (N-1)/(N-2)$$

and in writing $Fv = Fx +/- H$ the hysteresis is equal to $H = |FV - Fx|$
whence $H = Fx/(N-2)$ When the frequency Fv of the output signal of the oscillator 10 is sent back from $Fv = Fx - H$ to $Fv = Fx + H$ (FIG. 4), the hysteresis H should be such that: $H < 2F2min$ (F2min being the minimum value of the frequency F of the second reference signal) so that the loop gets appropriately re-locked. Consequently, the following relationship is deduced therefrom:

$$N > (Fx/2F2min) + 2$$

Assuming for example that Fx=20 MHz and F2min=40 kHz, according to the relationship (2), the value of N implies the use of an eight-bit counter. FIG. 6 shows a four-bit binary counter 615 that can be easily extended to eight bits. This binary counter with synchronous operation comprises:

a clock input to receive one of the frequencies Fv or Fx;
an asynchronous resetting-at-0 input RAZ;
an end-of-counting output TC;

This four-stage counter has a first stage (flip-flop $615_1$) with an asynchronous "CLEAR" function and a synchronous loading at 1 while all the upper stages (flips $615_2$ to $615_4$) have only the asynchronous "CLEAR" function. A NOR logic gate 617 with four inputs carries out the end-of-counting decoding to give the signal TC which is sent:

to the input "D" of the first flip-flop $615_1$, through a looping OR logic gate 618 to carry out the synchronous resetting at 1 of the first stage at the next clock stroke,
to an OR logic gate 619 to carry out the resetting at 0 of the three upper stages.

The flip-flops are connected to one another by their input "D" and their output "Q" through logic gates 620, 621, 622 to count from the binary number 0000 to 1111. The resetting-at-0 input (RAZ) is connected to the output of the symmetrical counter to receive the other signal TC. This enables the counter to start again at each cycle from the state 0001 while the other counter does not send it the resetting-at-0 signal (RAZ) which would make it start from the state 0000.

Figure 8:
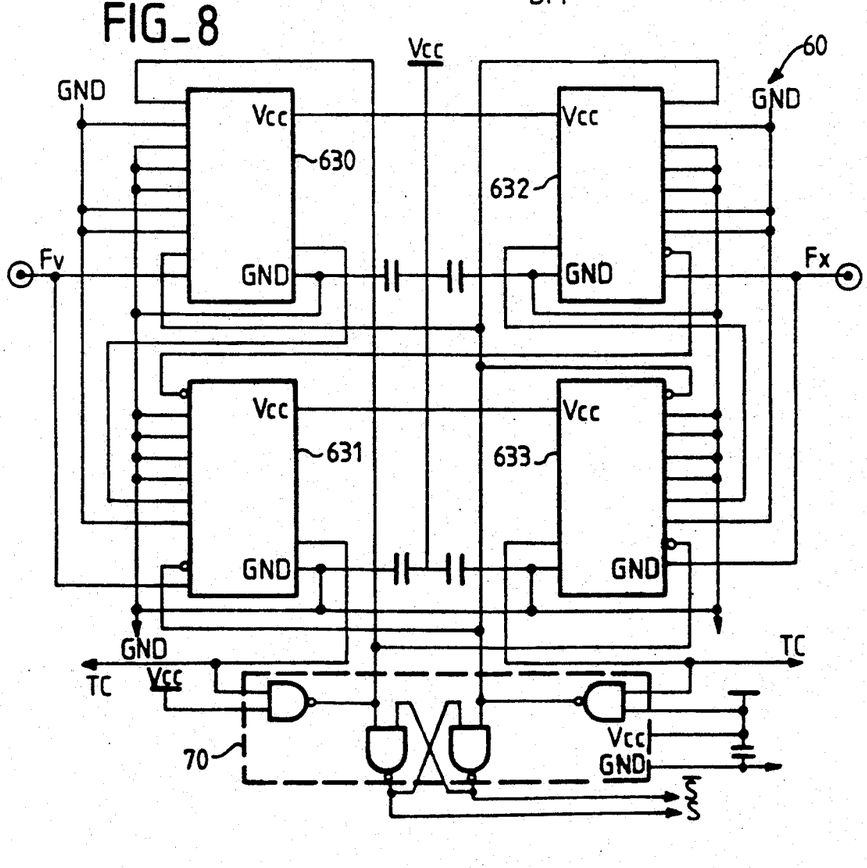
FIG. 8 shows a detailed view of the frequency comparator means of FIG. 5, comprising 8-bit digital counting circuits.

FIG. 8 shows a frequency comparator comprising four four-bit binary counters 630, 631, 632, 633 of the 74F161 type, coupled two by two to form two symmetrical eight-bit binary counters. The end-of-counting signals TC are applied to the input of a 74F00 type circuit 70 to give the inhibiting logic signal or signals S.

Figure 7:
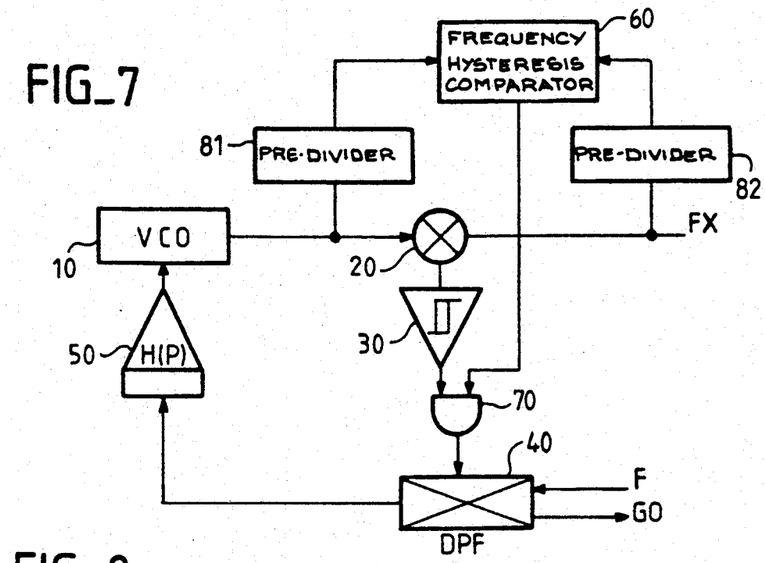
FIG. 7 is a functional diagram of a phase-locked loop with frequency changing comprising a variant of the control device according to the invention.

Referring now to FIG. 7, the control device according to the invention further comprises two pre-dividers 81, 82, for example binary pre-dividers, with a fixed ratio (4, 8, 16 or more), these pre-dividers being, for example; of the ECL $\frac{1}{2}$ SP8691A type with TTL output. The pre-dividers 81, 82 are placed upline from the two inputs of the frequency comparator 60 to match the synthesis and reference frequencies (in the case of very high frequencies) with the frequency characteristics of the frequency comparator.

Since the value of the hysteresis depends on the length of the counters (N), it is useful to provide for a plurality of end-of-counting outputs TC for each counter, corresponding to different maximum counting values, selected by a multiplexer so as to make the frequency comparator "universal" for an embodiment in application specific integrated circuit (ASIC) form.

The device for the control of a phase-locked loop with frequency changing has been tested for the following values of the phase-locked loop:

Fx = 1024 F2

Fmin = 20.86 kHz and Fmax > 400 kHz

The frequency hop applied in the loop is:
F1 = 390 kHz
F2 up to 20.86 kHz.

Figure 9:
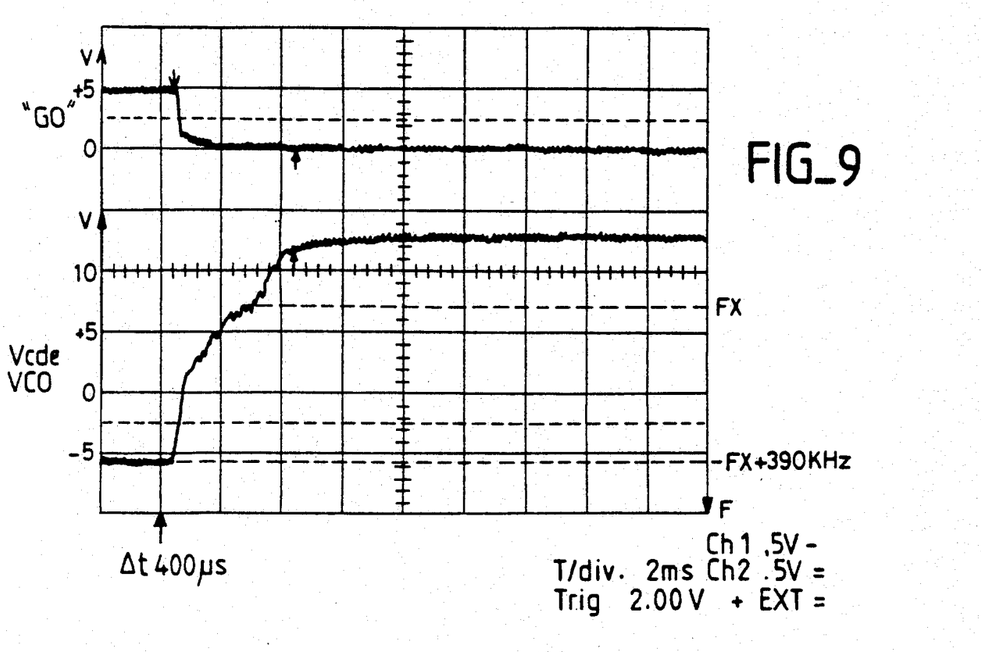
FIG. 9 shows the development of the servo signal in relation to the control signal without the control device according to the invention.

When there is no phase-locked loop control device according to the invention, as soon as the ratio F2/F1 is greater than 4, the loop gets blocked, the oscillator remains at the bottom stopping limit and the control signal GO given by the phase/frequency detector 40 remains at the level 0. FIG. 9 expresses a situation such as this measured on an oscilloscope with memory, where the control voltage (Vcde) of the oscillator (VCO) and the control signal (GO) are seen.

Figure 10:
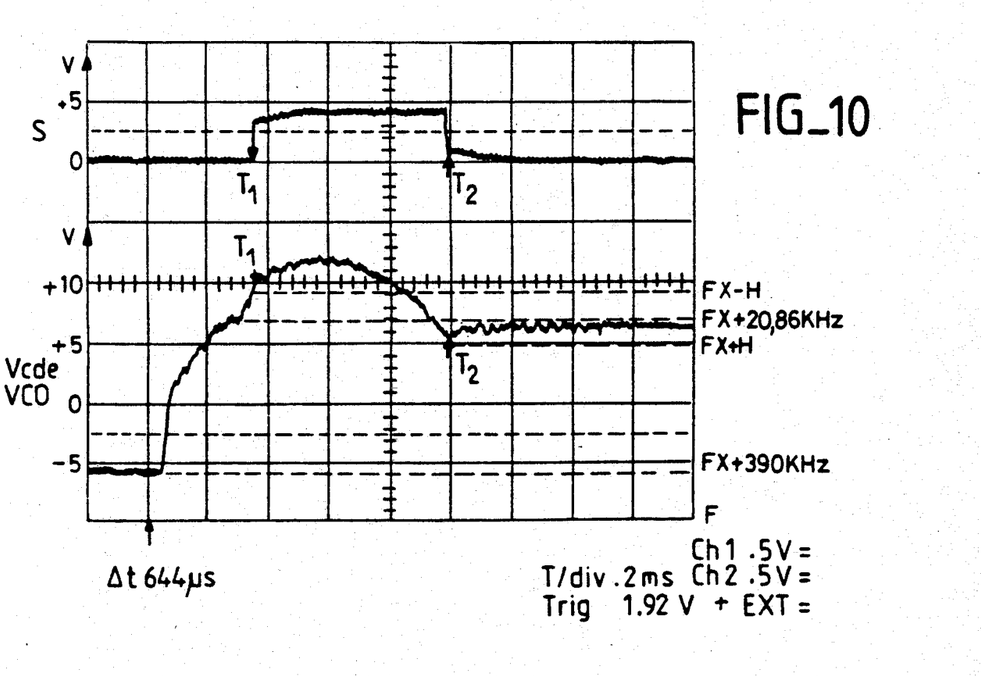
FIG. 10 shows the development of the servo signal in relation to the inhibiting signal with the control device according to the invention.

With the control device of FIG. 8 according to the invention, referring to FIG. 10, it is seen that the parabolic variation of the control voltage (Vcde) of the oscillator which starts from Fx−H reaches a maximum at about t1 = 230 μS and goes to the frequency Fx+H at the time t2 = 644 μS, after which the loop gets locked in phase and the oscillator stops at the instructed-value frequency Fx+20.86 kHz. This figure also shows the change in logic level of the inhibiting logic signal S (represented by its two's complement in FIG. 10) at the instants t1 and t2.

We shall now specify the performance characteristics of a phase-locked loop with frequency changing comprising a control device according to the invention. A phase-locked loop such as this comprises the following elements:

an oscillator (VCO) with a control slope Ko in Hz/V;
a phase/frequency detector (PFD) delivering a voltage $Vd = (Vdm/2Kpi) \cdot PH = Kd \cdot PH$, where PH is the phase in radians;
a pseudo-integrator amplifier having a transfer function $H1(p) = (1 + t2p)/t1p$ The transfer function in open loop of the phase-locked loop is then:

$$H(p) = Kv \cdot ((1 + t2p)/t1p \cdot p)$$

where $$Kv = 2 \cdot Pi \cdot Ko \cdot Kd \text{ (loop gain)}.$$

This loop has a cut-off pulsation Wc and an inherent pulsation Wn which are equal to:

$$Wc = Kv \cdot (t2/t1)$$

$$Wn = \sqrt{Kv/t1}$$

If the frequency F of the second reference signal is controlled to go from the frequency F1 to the frequency F2 which is far below the frequency F1, the phase-locked loop gets blocked and the oscillator goes beyond the bottom stopping limit Fx−H.

At this instant, the output of the frequency/hysteresis comparator goes to zero and blocks the input Fv−Fx of the phase detector which, thereafter, receives only the signal F2 at its other input.

The output voltage of the phase/frequency detector, which was at −Vdm will rise to +Vdm in 2K periods of the signal F2.

The time of this rise is therefore $To=2K/F2$ this voltage gradient has the equation $$V = Vdm(F2/K.t - 1)$$

and its Laplace transform is $$V(p) = Vdm(F2/K p^2 - 1/p)$$

This signal is applied to the pseudo-integrator amplifier, the transfer function of which is:

$$H(p) = (1 + t2p)/t1p$$

The output voltage generated by the pseudo-integrator amplifier is:

$$Vs(t) = \frac{Vdm}{t1} [F2/2K \cdot t^2 + (t2F2/(K-1))t - t2]$$

The frequency of the oscillator is $$fv(t) = Ko \cdot Vs(t) Vdm$$

giving $$fv(t) = Ko \cdot \frac{Vdm}{t1} [F2/2K \cdot t^2 + (t2F2/(K-1))t - t2]$$

This relationship is a parabola which touches a minimum at the time:

$$T1 = K/F2 - t2$$

The frequency swing from the starting point is:

$$Df = fv(T1) - fv(T0)$$

giving:

$$Df = Ko.Vdm/t1[t2 - K/2F2 - F2.t2^2/2K]$$

The inhibiting logic signal S changes its logic level when the frequency of the oscillator reaches the value $fv = Fx + H$, namely at the time T2 such that:

$$fv(T2) = Fv(T0) + 2H;$$

H being the hysteresis $H = Fx/(N-2)$.

The equation giving T2 is then a function of the characteristics Wc, Wn, K, Fx, F2:

$$T_2 = \frac{K}{F2} - \frac{Wc}{Wn^2} + \frac{1}{F2 \cdot Wn^2} \sqrt{(Wc \cdot F2 - K \cdot Wn^2)^2 + \frac{4 \cdot Fx \cdot F2 \cdot Wn^2}{N-2}}$$

What is claimed is:

1. A device for the control of a phase-locked loop with frequency changing comprising an oscillator controlled by a servo signal to give a synthesis signal having a pre-determined frequency, a mixer of signals sensitive to the synthesis signal and to a first reference signal having a first reference frequency to give a third signal representing a beat frequency, a detector means to detect a phase difference between the third signal and a second reference signal, the detector means giving the servo signal in response to this detection, wherein it comprise a frequency comparator means to compare the frequency of the synthesis signal and the frequency of the first reference signal, and an inhibiting means sensitive to the frequency comparator means and interposed between the mixer and the detector means to inhibit the third signal at input of the detector means.

2. The device according to claim 1, wherein the frequency comparator means compares the frequency of the synthesis signal and the frequency of the first reference signal with a hysteresis to give an inhibiting logic signal that represents the result of the comparison, the logic signal having a first logic level when the frequency of the synthesis signal is greater than the frequency of the first reference signal plus the hysteresis and the inhibiting signal having a second logic level when the frequency of the synthesis signal is lower than the frequency of the first reference signal minus the hysteresis.

3. The device according to claim 2, wherein the inhibiting means is constituted by a logic gate receiving, at input, the third signal and the inhibiting signal to inhibit the third signal when the inhibiting signal has a logic level corresponding to the second logic level.

4. The device according to claim 3, wherein the inhibiting means is constituted by and AND gate and the second logic level of the inhibiting signal corresponds to the logic level 0.

5. The device according to claim 3, wherein the frequency comparator means is constituted by two symmetrical binary counting means that are controllable, for the counting up to a pre-determined maximum counting value, respectively by the synthesis signal and the first reference signal, each counting means having an output to give an end-of-counting signal, and the comparator means further comprising a means sensitive to the end-of-counting signals to give the inhibiting signal.

6. The device according to claim 5, wherein each counting means is constituted by a binary counter with several stages, the first stage having a command for resetting at 1 and a command for resetting at 0, the upper stages having a command for resetting at 0, and the end-of-counting signal of a counting means controlling the resetting at 1 of the first stage of said counting means and the resetting at 0 of the first stage of the symmetrical counting means.

7. The device according to claim 6, wherein the frequency comparator means further includes means for the resetting at 0 of the upper stages of the binary counters which are controlled by the end-of-counting signals.

8. The device according to claim 7, wherein the means for the resetting at 0 of the upper stages are constituted by OR logic gates enabling the application, simultaneously with the resetting at 1 of the first stage of a binary counter, of the resetting at 0 of the upper stages of said counter in response to the end-of-counting signal given by said binary counter.

9. The device according to claim 8, wherein the maximum counting value is greater than $(Fx/2.F2min)+2$, where
   Fx is the frequency of the first reference signal;
   F2min is the minimum frequency of the second reference signal.

10. The device according to claim 1, further including two pre-dividers with a fixed ratio to respectively divide the frequency of the synthesis signal and the frequency of the first reference signal before their application to the input of the frequency comparator means.

* * * * *